(12) United States Patent
England et al.

(10) Patent No.: US 8,552,567 B2
(45) Date of Patent: Oct. 8, 2013

(54) SEMICONDUCTOR DIE ASSEMBLIES, SEMICONDUCTOR DEVICES INCLUDING SAME, AND METHODS OF FABRICATION

(75) Inventors: Luke G. England, Boise, ID (US); Paul A. Silvestri, Meridian, ID (US); Michel Koopmans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 13/192,014

(22) Filed: Jul. 27, 2011

(65) Prior Publication Data

US 2013/0026643 A1 Jan. 31, 2013

(51) Int. Cl.
*H01L 23/48* (2006.01)
*H01L 23/52* (2006.01)
*H01L 29/40* (2006.01)

(52) U.S. Cl.
USPC .......................................... 257/777

(58) Field of Classification Search
USPC ................................. 257/684, 777
See application file for complete search history.

(56) References Cited

U.S. PATENT DOCUMENTS

| | | | |
|---|---|---|---|
| 5,953,588 A | 9/1999 | Camien et al. | |
| 6,339,255 B1 | 1/2002 | Shin | |
| 6,459,159 B1 | 10/2002 | Miyagawa et al. | |
| 6,577,013 B1 | 6/2003 | Glenn et al. | |
| 6,652,799 B2 | 11/2003 | Seng et al. | |
| 7,180,166 B2 | 2/2007 | Ho et al. | |
| 7,388,294 B2 | 6/2008 | Klein et al. | |
| 7,595,017 B2 | 9/2009 | Siegel et al. | |
| 7,675,181 B2* | 3/2010 | Lee | 257/777 |
| 7,749,807 B2 | 7/2010 | Karnezos | |
| 7,820,483 B2 | 10/2010 | Belanger et al. | |
| 7,825,517 B2 | 11/2010 | Su | |
| 7,838,337 B2 | 11/2010 | Marimuthu et al. | |
| 8,110,910 B2* | 2/2012 | Kim | 257/686 |
| 8,143,719 B2* | 3/2012 | Toh et al. | 257/723 |
| 2002/0074637 A1 | 6/2002 | McFarland | |
| 2006/0038272 A1 | 2/2006 | Edwards | |
| 2007/0090517 A1 | 4/2007 | Moon et al. | |
| 2007/0194455 A1 | 8/2007 | Ikeda et al. | |
| 2007/0222050 A1 | 9/2007 | Lee et al. | |
| 2008/0079150 A1 | 4/2008 | Simon et al. | |
| 2008/0153187 A1 | 6/2008 | Luo et al. | |
| 2008/0237310 A1 | 10/2008 | Periaman et al. | |

(Continued)

FOREIGN PATENT DOCUMENTS

WO 2010/080068 A1 7/2010

OTHER PUBLICATIONS

PCT International Search Report, ISA/KR, Application No. PCT/US2012/047809, dated Jan. 24, 2013, three (3) pages.

(Continued)

*Primary Examiner* — Jenny L Wagner
(74) *Attorney, Agent, or Firm* — TraskBritt

(57) ABSTRACT

Methods of fabricating multi-die assemblies including a wafer segment having no integrated circuitry thereon and having a plurality of vertically stacked dice thereon electrically interconnected by conductive through vias, resulting multi-die assemblies, and semiconductor devices comprising such multi-die assemblies. The wafer segment may function as a heat sink to enhance heat transfer from the stacked dice in the resulting multi-die assembly. The die stacks are fabricated at the wafer level on a base wafer, from which the wafer segment and die stacks are singulated after at least peripheral encapsulation.

22 Claims, 8 Drawing Sheets

(56) References Cited

U.S. PATENT DOCUMENTS

| | | |
|---|---|---|
| 2009/0001598 A1 | 1/2009 | Chiou et al. |
| 2009/0004777 A1 | 1/2009 | Kolan et al. |
| 2009/0079067 A1 | 3/2009 | Gerber |
| 2010/0052157 A1 | 3/2010 | Pratt |
| 2010/0090338 A1 | 4/2010 | Lee et al. |
| 2010/0144094 A1 | 6/2010 | Chen et al. |
| 2010/0148316 A1 | 6/2010 | Kim et al. |
| 2010/0187683 A1 | 7/2010 | Bakir et al. |
| 2010/0279463 A1 | 11/2010 | Hsiao et al. |
| 2010/0314737 A1 | 12/2010 | Henderson et al. |
| 2011/0042820 A1 | 2/2011 | Knickerbocker |
| 2011/0079923 A1 | 4/2011 | Suh |

OTHER PUBLICATIONS

Written Opinion of the International Searching Authority, ISA/KR, Application No. PCT/US2012/047809, dated Jan. 24, 2013, six (6) pages.

* cited by examiner

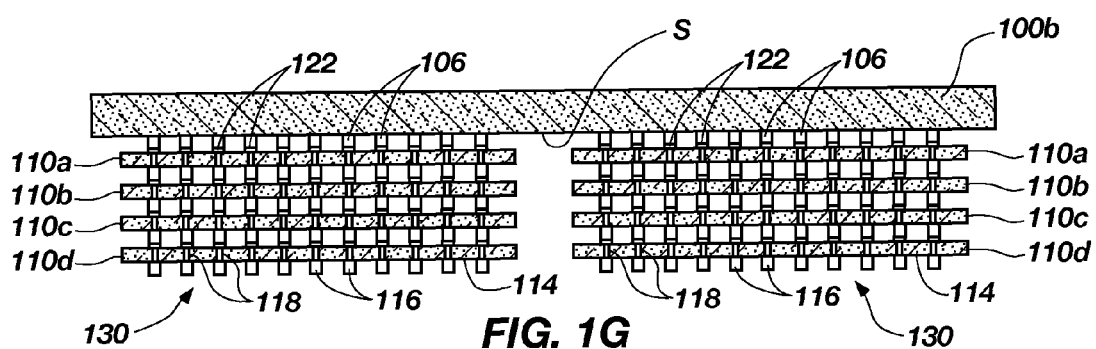
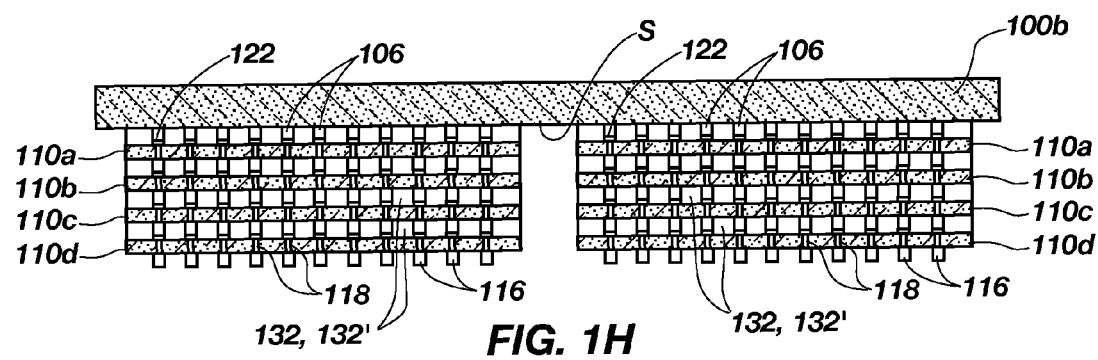
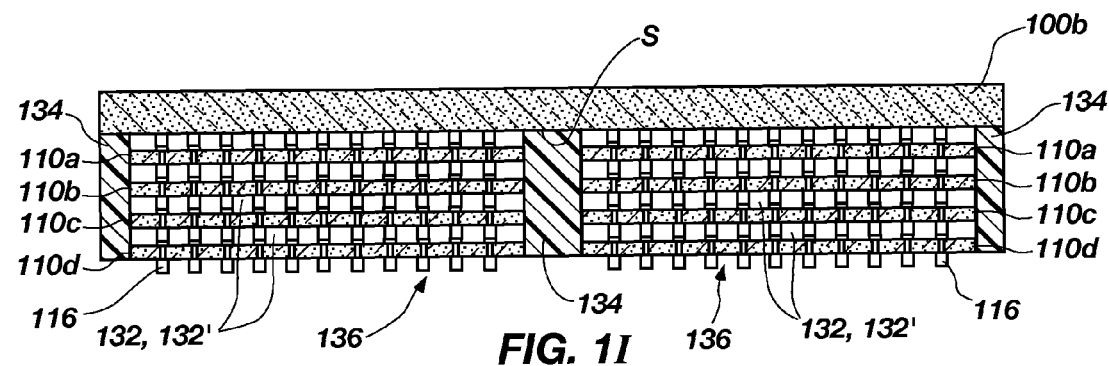
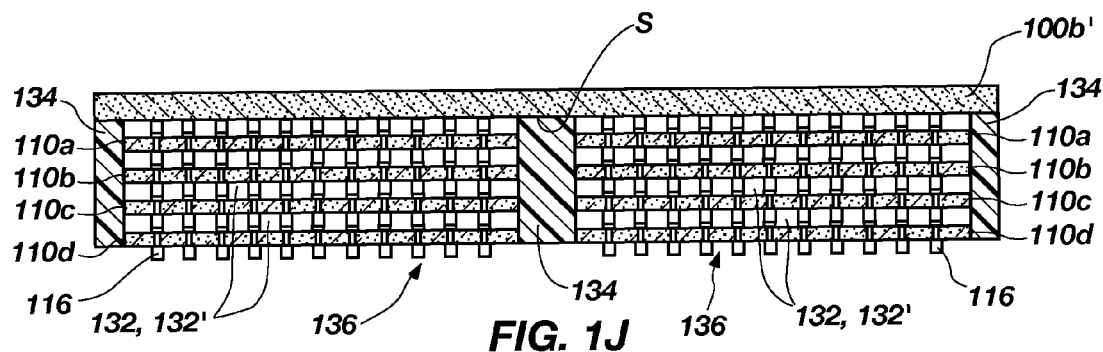

SEMICONDUCTOR DIE ASSEMBLIES, SEMICONDUCTOR DEVICES INCLUDING SAME, AND METHODS OF FABRICATION

TECHNICAL FIELD

Embodiments of the present disclosure relate to semiconductor die assemblies, to semiconductor devices including such assemblies, and to methods of fabrication of the assemblies.

BACKGROUND

Increased circuit density is an ongoing goal of manufacturers of semiconductor devices. One long-favored configuration is an assembly of vertically stacked semiconductor dice, at least some of which are interconnected electrically and the stacked die assembly being mechanically and electrically connected to higher level packaging, such as an interposer or other substrate bearing conductive traces.

One configuration employing a plurality of stacked semiconductor dice is a Micropillar Grid Array Package ("MPGA"). Such a package comprises a stack of a plurality (for example four (4)) of dynamic random access (DRAM) semiconductor memory dice vertically interconnected from an uppermost die to a lowermost die, and a plurality of conductive pillars extending from the underside of the lowermost memory die for connection to a logic die or a System on a Chip (SoC) die.

The provider of the logic die or the SoC die conventionally mounts their device to an interposer, such as a ball grid array (BGA) substrate, the logic or SoC die including conductive through vias for connection to the conductive pillars on the underside of the MPGA. The MPGA is mounted to the logic die or SoC die on the interposer, and the assembly is then overmolded with an encapsulant into a finished BGA package.

The aforementioned configuration, implemented as a so-called "Wide I/O" memory device, enables fast memory access, and reduces power requirements.

The end product finds application, among others, in mobile electronic devices such as so-called "smart phones" exemplified by BLACKBERRY® devices, IPHONE® devices, and DROID® devices, among others.

BRIEF DESCRIPTION OF THE DRAWINGS

FIGS. 1A through 1K illustrate an embodiment of a method for forming a semiconductor structure according to the present disclosure;

DETAILED DESCRIPTION

Figure 1A:
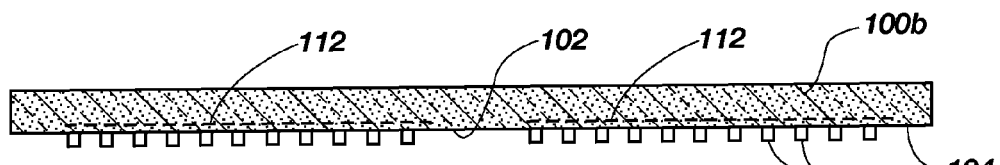

Semiconductor die assemblies are disclosed, semiconductor devices including same, and methods of fabricating same. As used herein, the term "wafer" means and includes a volume of a semiconductor material in the form of a bulk semiconductor substrate, and is not limited to conventional, substantially circular wafers. As used herein, the term "semiconductor material" means and includes silicon, germanium, gallium arsenide, indium phosphide, and other III-V or II-VI type semiconductor materials. As used herein, the terms "semiconductor die" and "die" and plural forms thereof, means and includes a segment or segments bearing integrated circuitry and singulated from a bulk semiconductor substrate. As used herein, the term "memory die" and plural forms thereof means and includes all forms of integrated circuit memory, by way of non-limiting example including DRAM, SRAM, Flash memory, and other memory forms. While only a few semiconductor dice and associated wafer segments are depicted in the drawing figures for clarity, it is of course conventional that hundreds or even thousands of dice may be fabricated on, and singulated from, a single source wafer. Likewise, hundreds or even thousands of segments may be singulated from a single base wafer.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. Only those process acts and structures necessary to understand the embodiments of the present disclosure are described in detail below. Additional acts to form a complete semiconductor device from the semiconductor structures may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to implement embodiments of the present disclosure. However, other embodiments may be implemented, and structural, logical, and electrical changes encompassed by the disclosure may be made. The illustrations presented herein are not meant to be actual views of any particular assembly, memory device, logic device, or system, but are merely idealized representations that are employed to more completely describe the embodiments of the present disclosure. The drawings presented herein are not necessarily drawn to scale. Additionally, elements common between drawings may retain the same or a similar numerical designation.

Employing a fabrication process according to some embodiments of the present disclosure offers significant advantages to both the manufacture and resulting product in the form of stacked die assemblies, including without limitation, MPGA packages. For example, the singulation of a base wafer with a plurality of spaced semiconductor die stacks thereon between the die stacks enhances thermal performance of each resulting die stack package by providing a heat sink in the form of the singulated base wafer segment. Use of a relatively thick, robust base wafer to fabricate stacked die packages thereon enhances mechanical strength and facilitates handling of the assembly, while thinning of the base wafer prior to singulation enables reduction of the height of the resulting stacked die package. The base wafer segment, which does not include active circuitry, may be laser marked without fear of damage to an ultra-thin active die. An encapsulation structure formed around each die stack provides mechanical protection for relatively fragile, thin semiconductor dice incorporating conductive through vias. The die-to-wafer process employed for stacking results in the ability to use wafer level processes downstream, enabling higher throughput and reduced costs. For example, wafer level testing of the encapsulated die stacks may be performed before singulation. In addition, the use of a base wafer allows for a larger step size, due to the larger die pitch enabled by the use of the spaced die stacks on the base wafer during wafer level packaging, so that a standard scribe width may be employed. Further, the use of known good die (KGD) minimizes packaging costs.

One embodiment comprises a method of forming a semiconductor die assembly, comprising securing a plurality of laterally spaced semiconductor dice having conductive through vias to a base wafer having thermally conductive elements protruding therefrom in alignment with the conductive through vias, stacking a plurality of semiconductor die over each semiconductor die of the plurality of laterally spaced semiconductor dice and connecting conductive through vias of stacked semiconductor dice with conductive elements extending therebetween. A dielectric material is introduced between the semiconductor dice and at least a periphery of the semiconductor dice on the base wafer are encapsulated with an encapsulant material between and around the semiconductor dice, followed by severing through the encapsulant material and through the base wafer between stacks of semiconductor dice.

Referring now to FIGS. 1A through 1G of the drawings, a process sequence for fabrication of a semiconductor die stack according to an embodiment of the present disclosure is described.

Figure 4:
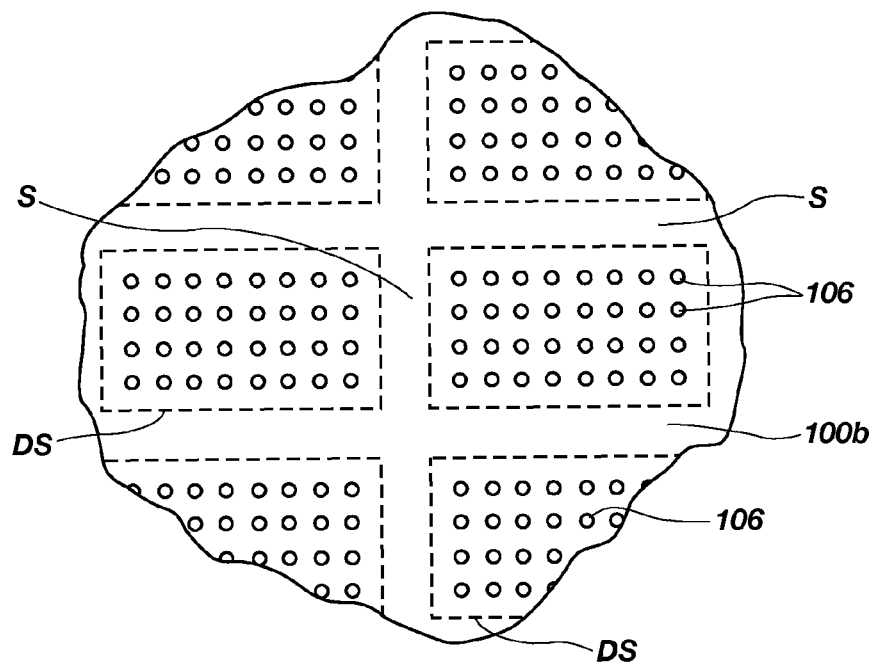
FIG. 4 is a plan view of a portion of the base wafer depicted in FIG. 1A.

FIG. 1A depicts a side sectional elevation of a base wafer 100*b* of semiconductor material, for example silicon, of a thickness of about 500 μm to about 800 μm. FIG. 4 depicts a plan view of a portion of base wafer 100*b* showing several die stack locations DS thereon in broken lines, with streets S therebetween, the width of streets S being exaggerated for clarity. In one embodiment, base wafer 100*b* has no integrated circuitry fabricated thereon. A dielectric material 104 in the form of a film or other coating is applied over surface 102, followed by fabrication or application of a plurality of thermally conductive elements 106, which may also be electrically conductive and which are electrically isolated from base wafer 100*b* by dielectric material 104 and which are laterally spaced and, thus, mutually electrically isolated as depicted in FIG. 1A and FIG. 4. Thermally conductive elements may comprise metal pillars, which may also be characterized as columns or studs, or solder balls. If metal pillars are employed, copper, as one suitable material, may be electroplated on a seed layer (not shown) on dielectric material 104, or sputtered onto dielectric material 104, as is conventional. Thermally conductive elements 106 may then be formed by masking, patterning of the mask, and removal of the unmasked thermally conductive material by a conventional technique, such as etching, to form electrically isolated pillars. Other metals and alloys, for example gold and silver, may be employed. Another approach for pillar formation is application of a seed layer, masking of the seed layer, and forming pillars by electroplating on unmasked portions of the seed layer providing pillar locations, followed by optional removal of the mask and unplated seed layer. If solder balls are employed, segments of a solder paste may be applied to isolated metallic pads formed or otherwise disposed on dielectric material 104 and reflowed to form solder balls, or preformed solder balls may be applied to the pads and reflowed sufficiently to bond thereto. By way of example only, thermally conductive elements 106 in the form of 20 μm diameter copper pillars may be employed, at a 40 μm minimum pitch.

Figure 1B:
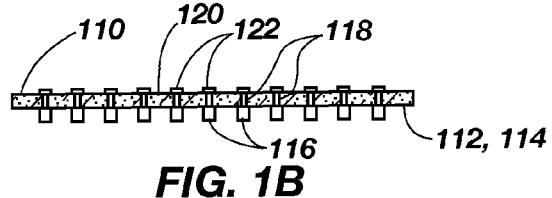

FIG. 1B depicts a schematic cross-section of an active device in the form of semiconductor memory die 110, which has been prepared for stacking. Memory die 110 comprises integrated circuitry 112 on an active surface 114 thereof, on which a plurality of thermally and electrically conductive elements 116 are formed over conductive through vias 118, which may also be referred to for the sake of convenience using the industry term "through silicon vias," or "TSVs," and which extend to a back side 120 of memory die 110. TSVs 118 terminate on back side 120 at conductive landing pads 122 or at traces of a redistribution layer (RDL) extending to landing pads 122. The landing pads 122 are located to align with thermally conductive elements 106 of base wafer 100*b*, with thermally and electrically conductive elements 116 of another memory die 110 or with connective elements of a logic die or a SoC die, as will be subsequently described. Conductive through vias 118 may be formed using conventional techniques, as may be the RDL, if employed, and landing pads 122.

Figure 1C:
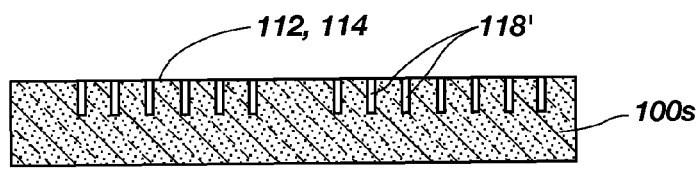
Figure 1D:
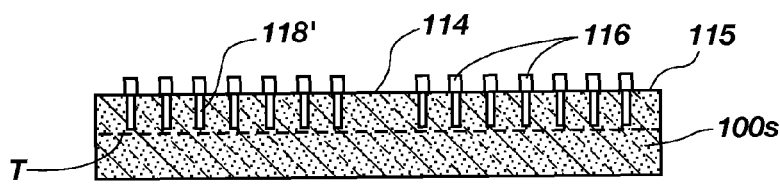
Figure 1E:
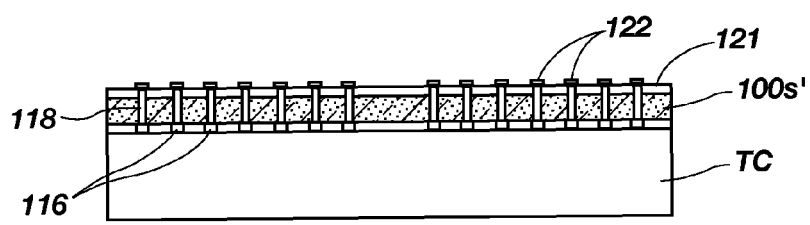

For example, the enlarged view of FIG. 1C shows through via precursor structures 118' formed in a desired pattern partially through a source wafer 100*s* using wafer level processing after fabrication of integrated circuitry 112 on active surface 114 at each location for a memory die 110 by etching, then lined with a dielectric, and lined or filled with a conductive material. Subsequently, thermally and electrically conductive elements 116 may be formed as depicted in FIG. 1D, as described above with reference to formation of thermally conductive elements 106 of FIG. 1A. As also shown in FIG. 1D, the source wafer 100*s* may then be thinned as indicated at broken line T to expose the via ends and form conductive through vias 118, resulting in a die of about 50 μm thickness, by way of non-limiting example. The RDL, if employed, and landing pads 122 (FIG. 1E), may then be formed. Memory die 110 is a so-called known good die, abbreviated as KGD, meaning memory die 110 has been tested to specific performance parameters for the intended application for the die 110.

More specifically, source wafer 100*s* has a passivation material 115, such as a polyimide, polybenzoxazole (PBO), or bismalemide Triazine (BT) resin, or silicon nitride or a silicon oxide, applied to active surface 114, and thermally and electrically conductive elements 116 comprising metal pillars, such as copper pillars, may be formed thereover. Other metals and alloys, for example of gold and silver, may be employed. Thermally and electrically conductive elements 116 may also comprise solder balls, which may be formed as described above by reflowing solder paste segments or partially reflowing preformed solder balls on under bump metallization (UBM), for example nickel, exposed through apertures in a silicon nitride passivation layer.

Source wafer 100*s* with thermally and electrically conductive elements 116 formed thereon may be mounted on a temporary carrier TC (FIG. 1E) as known in the art and thinned to, for example, a thickness of about 50 μm to expose the ends of conductive through via precursor structures 118' on the back side 120 of each base wafer 100*b*, forming conductive through vias 118. An abrasive process, such as back grinding, followed by a fluorine or chlorine-based reactive ion etching (RIE) silicon dry etch process, may be used to thin source wafer 100*s*.

The back side 120 of thinned source wafer 100*s'* is coated with a polymer passivation material 121, such as a polyimide, PBO or BT resin, or silicon nitride or a silicon oxide, and solderable interconnects in the form of landing pads 122, for example, of nickel on the ends of conductive through vias 118 comprising copper, are formed by electroplating over passivation material 121 and in contact with conductive through vias 118 through openings in passivation material 121, then masking and etching to define landing pads 122.

Thinned source wafer 100*s'* is mounted to a film frame, and the temporary carrier is removed. Thinned source wafer 100*s'* is then singulated into individual dice 110.

Figure 1F:
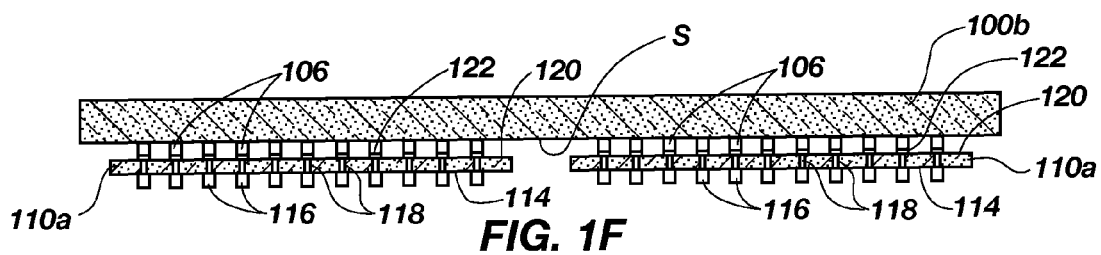

As depicted in FIG. 1F, a plurality of laterally spaced memory dice 110*a* having conductive elements 116 extending from surfaces thereof are removed from a thinned source wafer 100*s'* after singulation therefrom using a conventional pick and place operation and placed on, and bonded to, base wafer 100*b* at die stack locations DS by landing pads 122 on back sides 120 thereof aligned with thermally conductive elements 106.

As depicted in FIG. 1G, additional memory dice 110*b*, 110*c* and 110*d* having conductive elements extending from surfaces thereof may be respectively stacked and secured, one above the other, onto and oriented in a common direction (for example, active surface 114 facing away from base wafer 100*b*) as each memory die 110*a* secured to base wafer 100*b*. It is also contemplated that memory dice 110*a* through 110*d* may be mixed in orientation, with thermally and electrically conductive elements 116 and landing pads 122 formed over either an active surface 114 or a back side 120 of a given die 110, as desired to facilitate stacking thereof. Further, and as described below with regard to another embodiment of the disclosure, dice of a given die stack may be oriented with active surfaces facing a base wafer. The semiconductor dice 110*a* through 110*d* of each die stack may be electrically and mechanically connected, and secured to base wafer 100*b*, using conductive elements 106 and 116 one level at a time, or after all the die stacks are completed.

As noted, stacking additional memory dice comprises stacking at least two semiconductor dice over each semiconductor die of the plurality of laterally spaced semiconductor dice secured to the base wafer and may further comprise stacking at least two semiconductor dice having conductive elements extending from surfaces thereof.

All memory dice 110*a* through 110*d* employed to repopulate base wafer 100*b* have been qualified as KGD. As illustrated, each completed die stack 130 comprises four memory dice 110*a*-110*d*, but the disclosure is not so limited.

After placement of each level of dice 110*a* through 110*d* on base wafer 100*b*, thermally conductive elements 106 and thermally and electrically conductive elements 116 may be bonded to landing pads 122 at the wafer level using a conventional thermocompression or ultrasonic bonding process one level at time, if metal pillars are employed, or a reflow operation, if solder bumps are employed or a solder material is disposed, for example, between elements 116 comprising copper pillars and landing pads 122.

As depicted in FIG. 1H, a dielectric material in the form of capillary underfill 132 is applied and cured between base wafer 100*b* and memory dice 110*a* through 110*d* of each die stack 130 about thermally conductive elements 106 and thermally and electrically conductive elements 116. If desired, an epoxy underfill material 132' may be pre-applied to memory dice 110 in lieu of the use of a capillary underfill, and cured.

Referring to FIG. 1I, base wafer 100*b*, populated with die stacks 130, is then subjected to a wafer level molding process to provide an electrically insulative, which may also be characterized as a dielectric, encapsulation structure 134 around and between the die stacks 130 including memory dice 110*a*-110*d* for mechanical and environmental protection thereof and in contact with base wafer 100*b*, forming a plurality of unsingulated, encapsulated die stacks 136 on base wafer 100*b*. One particularly suitable technique is film assist molding, as described in U.S. Pat. Nos. 7,595,017; 6,652,799; and 6,459,159, which process protects the integrity of thermally and electrically conductive elements 116 protruding from memory dice 110*d*.

After molding of the encapsulation structure 134 and as indicated in FIG. 1J, base wafer 100*b* is back ground to thin it from its initial 500 μm to 800 μm thickness to, for example, about 100 μm to about 150 μM, resulting in thinned base wafer 100*b'*.

After thinning of base wafer 100*b*, a test of each die stack 130 is conducted, and good die stack locations determined by a test are marked.

Figure 1K:
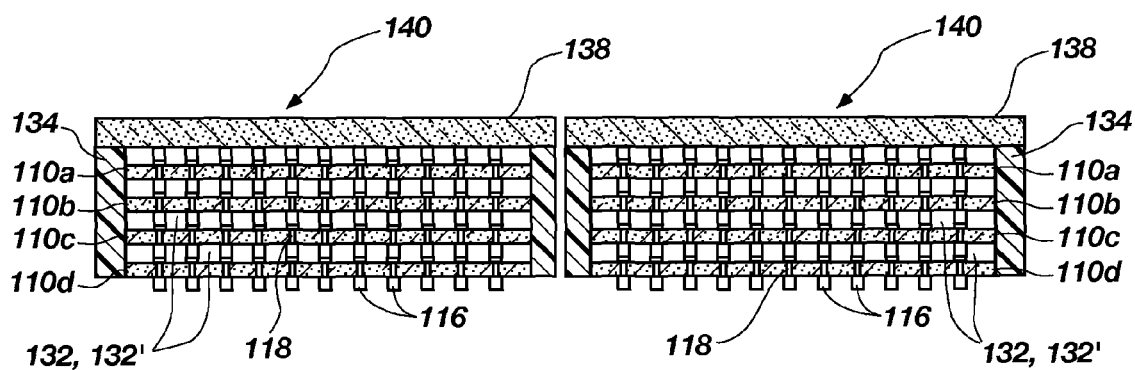

After encapsulation, and as depicted in FIG. 1K, thinned base wafer 100*b'* and encapsulation structure 134 thereover is singulated between die stacks 130 and through thinned base wafer 100*b'* along street S (FIG. 4) to form a plurality of stacked die packages 140 each including a wafer segment 138, which may also be characterized as a support and heat sink segment, and memory dice 110*a* through 110*d*, the wafer segment 138 being of greater lateral extent than the semiconductor dice 100*a* through 110*d*. Stacked die packages may, as depicted in FIG. 2M with respect to a subsequent embodiment, be placed in pockets in a tape for shipment to and use by a customer.

In the foregoing embodiment, the die stack 130 may comprise functionally different semiconductor dice in addition to, or in lieu of, memory dice. In other words, the architecture of die stack 130 and stacked die package 140 is adaptable to applications other than memory die stacks, and specifically MPGA packages as mentioned above. For example, semiconductor die 110*a* may comprise a logic die.

In another embodiment of the disclosure, it is contemplated that base wafer 100*b* and resulting base wafer segment 138 may incorporate integrated circuitry and be operably coupled using thermally conductive elements 106, which in such an instance would also be formed of an electrical conductive material and correspond to thermally and electrically conductive elements 116 in function, and, due to the absence of dielectric material 104, to the remainder of the semiconductor dice in die stack 130. One application for such a configuration is to fabricate base wafer 100*b* with integrated circuitry 112 as shown in broken lines in FIG. 1A and to only employ three other memory dice 110*a*-110*c*, to provide a stack of four memory dice while maintaining package height within required parameters to enable use of a larger (thicker) logic or SoC device at the base of the die stack.

A further embodiment comprises a method of forming a semiconductor die assembly, comprising securing a plurality of laterally spaced semiconductor dice to a base wafer, disposing at least two semiconductor dice over each semiconductor die of the plurality to form a stack and connecting conductive through vias of the semiconductor dice in a stack with conductive elements extending therebetween. A dielectric material is provided between the semiconductor dice in a stack, and at least a periphery of each of the stacks of semiconductor dice on the base wafer is substantially simultaneously encapsulated with an encapsulant material between and around the stacks of semiconductor dice and the stacks of semiconductor dice and the base wafer are singulated through the encapsulant material between the stacks of semiconductor dice.

In this embodiment, a process flow for fabrication of which is depicted in FIGS. 2A through 2M, stacked dice with conductive through vias are mounted to a base wafer segment oriented in a common, face-down direction, wherein the active surfaces of the dice face the base wafer segment and, consequently, are protected during processing or handling of the die stack. As such an orientation results in probe and/or test pads being inaccessible for testing of the stacked die package, back side contacts on the most distant die from the base wafer are provided for testing, in addition to interconnects for operably coupling the die stack to a logic die or a SoC die. Of course, semiconductor dice within a stack may have differing orientations, as desired.

Figure 2A:
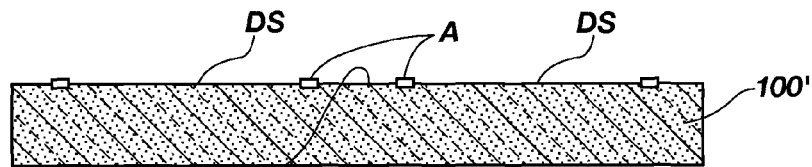
FIGS. 2A through 2M illustrate another embodiment of a method for forming a semiconductor structure according to the present disclosure.

As depicted in FIG. 2A, a base wafer, such as a silicon wafer 100', having no integrated circuitry thereon has alignment marks A applied thereto to facilitate die placement thereon at die stack locations DS.

Figure 2B:
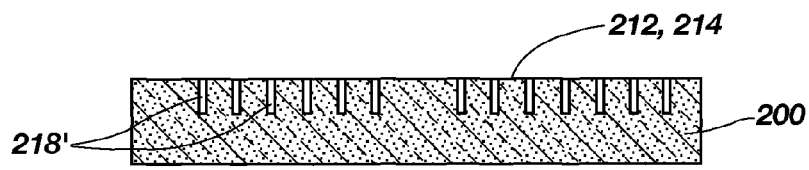

In FIG. 2B, source wafers 200 having integrated circuitry 212, for example, memory circuitry for a plurality of dice, fabricated on active surface 214 thereof and conductive through via precursor structures 218' extending therethrough are probed and tested at wafer level to characterize those suitable for use as KGD.

Figure 2C:
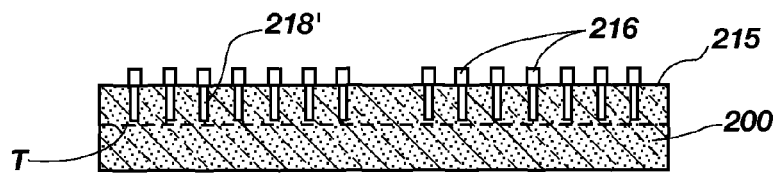

As shown in FIG. 2C, some of source wafers 200 have a passivation material 215 applied thereto, such as a polyimide, polybenzoxazole (PBO), or bismalemide triazine (BT) resin, or silicon nitride, and thermally and electrically conductive elements 216 comprising metal pillars, such as copper pillars, may be formed in a pattern of apertures therethrough in contact with conductive through via precursor structures 218'. Thermally and electrically conductive elements 216 may also comprise solder balls, which may be formed as described above by reflowing solder paste segments or partially reflowing preformed solder balls on under bump metallization (UBM), for example nickel, exposed through apertures in a silicon nitride passivation layer. All of the source wafers 200, including both those with thermally and electrically conductive elements 216 and those without, may be mounted on temporary carriers TC (see FIG. 2D) as known in the art and thinned as indicated at broken line T (FIG. 2C) to, for example, a thickness of about 50 µm to expose the ends of conductive through via precursor structures 218' on a back side 220 of each wafer 200, forming conductive through vias 218. An abrasive process, such as back grinding, followed by a silicon dry etch process, may be used to thin wafers 200.

Figure 2D:
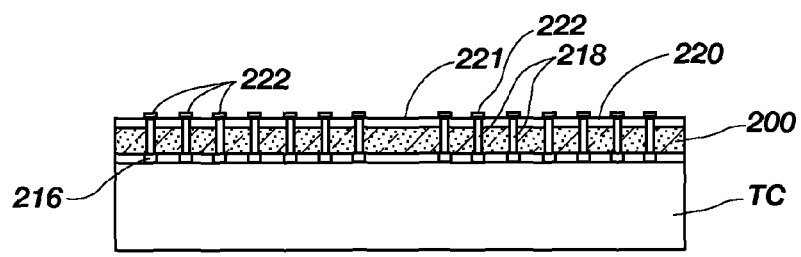

FIG. 2D depicts coating of the back side 220 of a thinned source wafer 200 with a polymer passivation material 221 such as a polyimide, PBO or BT resin, or silicon nitride or a silicon oxide, and solderable interconnects in the form of landing pads 222, for example, of nickel on the ends of conductive through vias 218 comprising copper, are electroplated.

Figure 2E:
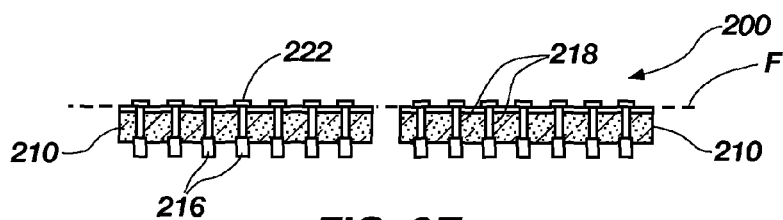

In FIG. 2E, a thinned source wafer 200 is mounted to a film frame F, and temporary carrier TC is removed. Wafer 200 is then singulated into individual dice 210.

Figure 2F:
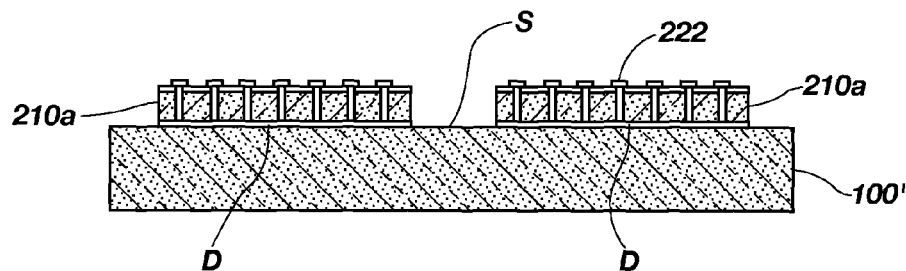

In FIG. 2F, individual dice 210a of a configuration without thermally and electrically conductive elements 216 thereon are mounted to a base wafer 100' devoid of integrated circuitry in laterally spaced relationship at die stack locations (FIG. 2A) leaving streets S therebetween as also shown in FIG. 4 with respect to the first described embodiment using alignment marks (not shown) using a die attach film (DAF) D of, for example, about 10 µm to about 20 µm thickness, which is then cured to affix dice 210a to base wafer 100', or a flowable dielectric material.

Figure 2G:
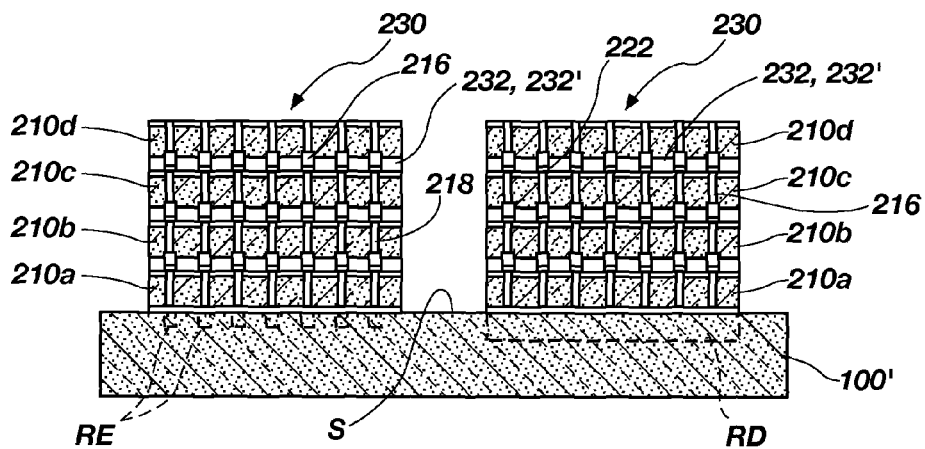

As depicted in FIG. 2G, a non-conductive epoxy paste 232 is dispensed at each die stack site over a die 210a and another die 210b having thermally and electrically conductive elements 216 extending from a surface thereof, is disposed thereover with elements 216 aligned with landing pads 222. The non-conductive epoxy paste 232, which includes a solder flux, is displaced from between landing pads 222 and elements 216 by compression of die 210b against die 210a. As an alternative, a no-flow epoxy underfill 232' may be preapplied to the back side of die 210a.

Figure 5:
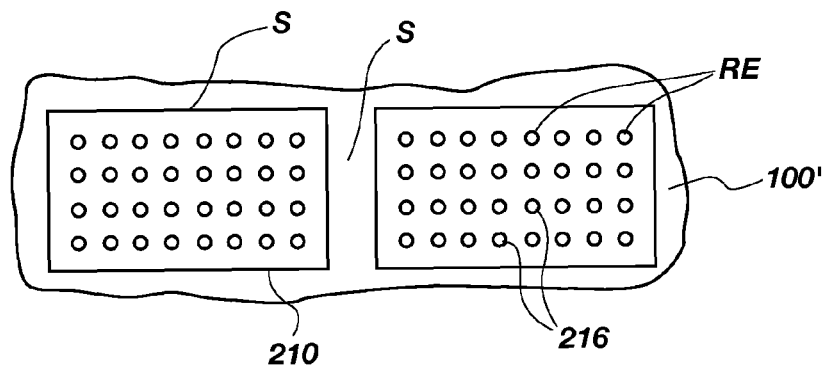
FIG. 5 is a plan view of a portion of the base wafer of FIG. 2G showing recesses RE as depicted in broken lines at the left-hand side of FIG. 2G.

As further depicted in FIG. 2G at the left-hand side in broken lines, rather than using a specially configured die 210a without thermally and electrically conductive elements 216, recesses RE to accommodate such elements 216 may be dry etched, such as by reactive ion etching, into base wafer 100' using a conventional masking, patterning and etching technique. Die 210 with elements 216 extending therefrom may then be adhered to wafer 100' using a flowable dielectric material. FIG. 5 depicts a portion of the base wafer 100' with recesses RE as viewed from above within a die and elements 216 received therein, the footprint of a semiconductor die 210 bearing elements 216 also being shown for reference. In such an arrangement, semiconductor dice of the plurality of laterally spaced semiconductor dice 210 are placed onto the base wafer with conductive elements 216 thereof at least partially received in a corresponding plurality of recesses RE in the base wafer 100'.

Figure 6:
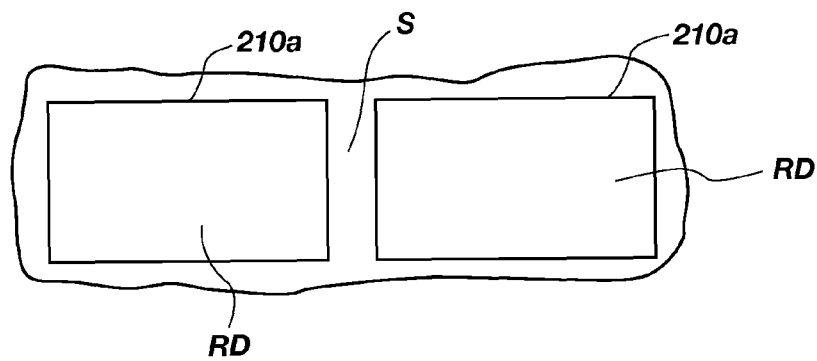
FIG. 6 is a plan view of another portion of the base wafer of FIG. 2G showing recess RD as depicted in broken lines at the right-hand side of FIG. 2G.

As additionally depicted in FIG. 2G, at the right-hand side thereof and as shown in broken lines, a recess RD, which may also be characterized as a cavity to accommodate some or substantially all of the depth of a die 210a may, again, be etched into base wafer 100' to minimize the height of the die stack being fabricated. FIG. 6 depicts a portion of the base wafer 100' with recesses RE as viewed from above and the footprint of a semiconductor die 210a at least partially received therein. In such an arrangement, semiconductor dice 210a of the plurality of semiconductor dice may be at least partially placed into laterally spaced recesses in the base wafer 100'.

Of course, a die recess RD may be formed, followed by recesses RE in the bottom thereof, as desired.

As also shown in FIG. 2G, the die stacking sequence is repeated for a plurality of dice 210c, 210d having conductive elements extending from surfaces thereof at each die site over previously stacked dice 210a, 210b to form a die stack 230. As before, a non-conductive paste 232 may be employed, and the non-conductive paste 232 cured after the die stack 230 is completed, or a preapplied no-flow epoxy underfill 232' may be employed.

As an alternative to the use of a non-conductive paste or a pre-applied epoxy underfill, a flux may be applied to landing pads 222 of each die 210 when solder balls are employed as elements 216, the solder balls reflowed to bond to landing pads 222, then cooled and a capillary underfill disposed between the dice 210 of each die stack 230.

Securing the semiconductor dice 210b, 210c and 210d to one another and to a semiconductor die 210a of the plurality of laterally spaced semiconductor dice may be effected after a die stack 230 is completed or one level at a time, using one of solder reflow, thermocompression bonding and ultrasonic bonding, depending upon the material used for thermally and electrically conductive elements.

Figure 2H:
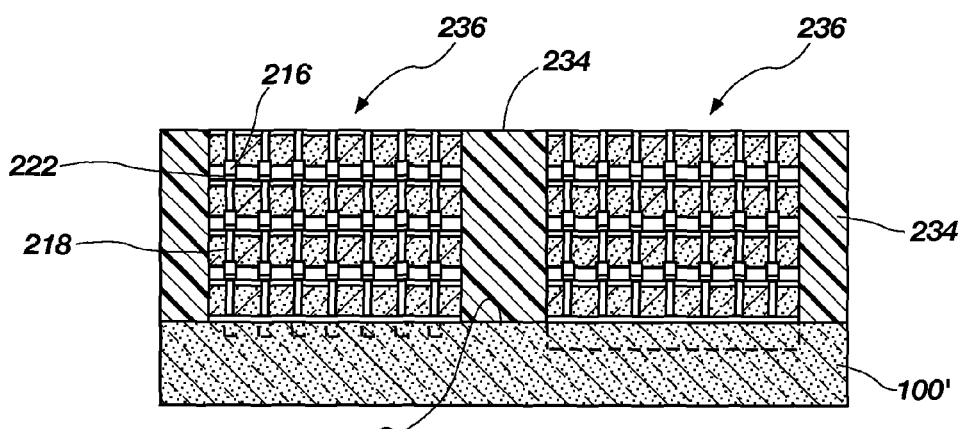

In FIG. 2H, the die stacks 230 are overmolded on base wafer 100' using, for example, film assisted molding or compression molding of an electrically insulative material, to provide a covering encapsulation structure 234 around and between die stacks 230, resulting in encapsulated die stacks 236.

Figure 2I:
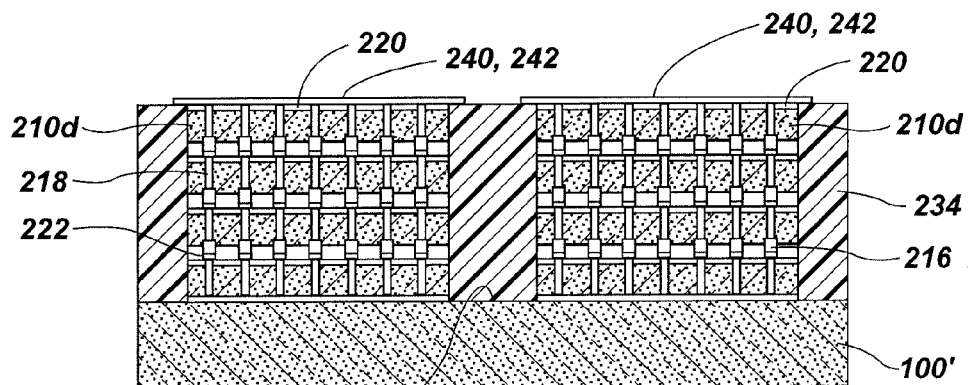
Figure 2J:
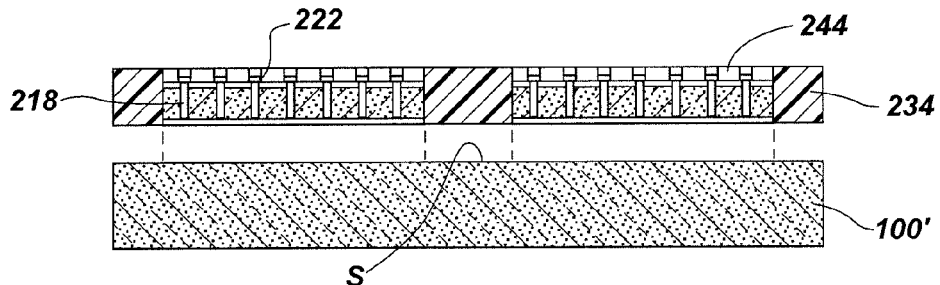

As shown in FIG. 2I, a redistribution layer comprising conductive traces 240 and probe pads 242, for example, of copper, is formed by electroplating followed by masking, patterning and etching, over the back side 220 of each die 210d farthest from base wafer 100'. Back sides 220 of dice 210d are then repassivated 244 as shown in FIG. 2J, and patterned over the ends of conductive through vias 218. Back side thermally and electrically external connection conductive elements 246 electroplated thereon as shown in FIG. 2K.

Figure 2K:
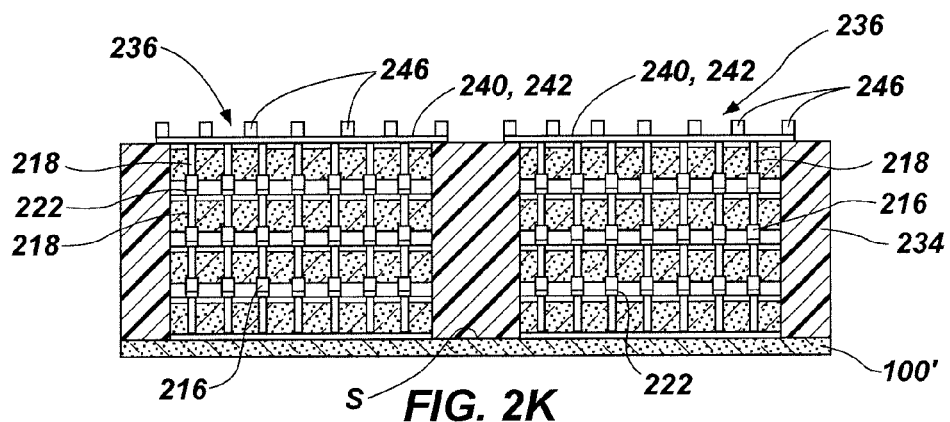

In FIG. 2K, base wafer 100' with encapsulated die stacks 236, is thinned using, for example, back grinding, to a thickness of, for example, about 50 μm to about 150 μM. A citric acid dip may then be employed to clean the copper probe pads 242 in preparation for conducting a test of each die stack, after which the locations of good die stack locations as determined by a test may be laser marked on base wafer 100'.

Figure 2L:
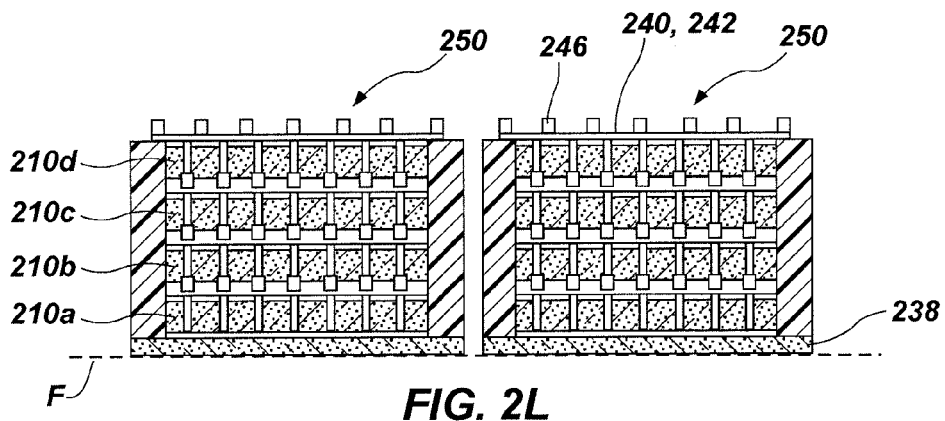
Figure 2M:
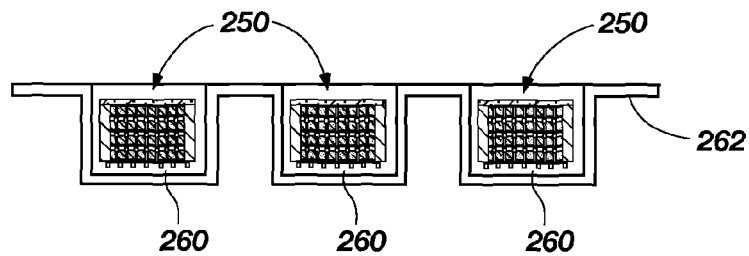

As shown in FIG. 2L, wafer 100' repopulated with encapsulated die stacks 236 may then be placed on a film frame F and singulated through the encapsulant structure 234 and through the body of wafer 100' into stacked die packages 250, each comprising semiconductor dice 210a-210d and a base wafer segment 238. As with a previous embodiment, base wafer segment provides a heat sink for enhanced thermal performance of the stacked die package 250.

Thus, before singulating through the encapsulant material and through the base wafer between stacks of semiconductor dice, contacts to conductive through vias of semiconductor dice farthest from the base wafer are left at least partially free of encapsulant material, and redistribution circuitry including pads for testing in communication with conductive through vias is formed over a back side of each semiconductor die farthest from the base wafer in a stack, passivation is applied over a back side of each semiconductor die farthest from the base wafer in a stack and the pads and contacts to the conductive through vias thereof are left exposed, and external connection conductive elements over and connected to contacts to the conductive through vias are formed.

Following singulation, stacked die packages 250 may be removed from the film frame by a pick-and-place apparatus and disposed in pockets 260 in a tape 262 as shown in FIG. 2M for use in a tape and reel device of a customer, and shipped to the customer. Of course, the stacked die packages 140 of the first embodiment may be packaged for shipping in a similar manner.

Figure 2N:
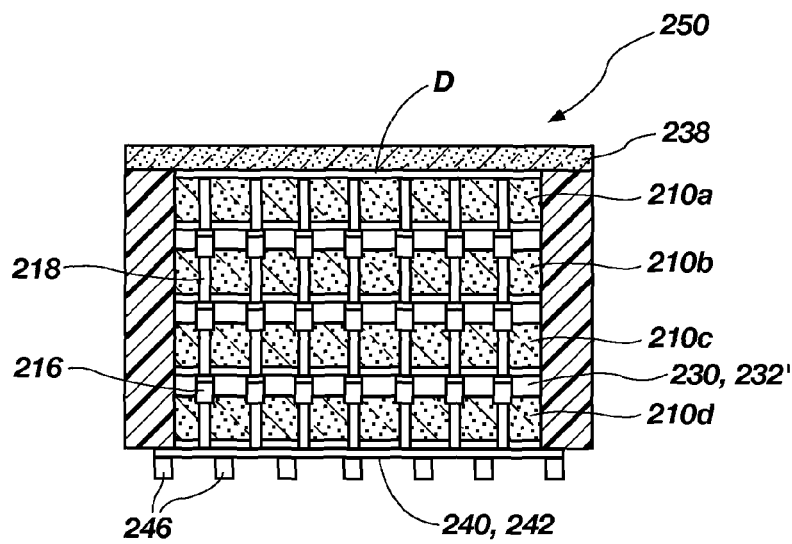
FIGS. 2N and 2O depict, respectively a side sectional elevation and an end (bottom) elevation of a completed, stacked die package formed by the method of FIGS. 2A through 2L.
Figure 2O:
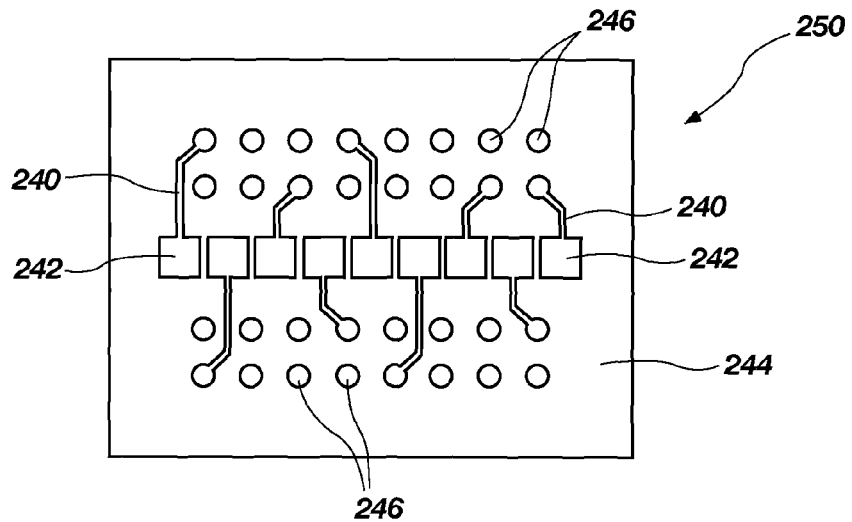

A completed, inverted stacked die package 250 is depicted in FIG. 2N. An end view of stacked die package 250 showing traces 240, probe pads 242, passivation 244 and external connection conductive elements 246 is depicted in FIG. 2O.

In the foregoing embodiment, active surfaces of the stacked semiconductor dice are, due to their orientation facing the base wafer, well protected during processing. The probe pads enable probe testing of the stacked dice at the wafer level in such an orientation.

A resulting semiconductor die assembly of the disclosure may comprise a wafer segment having no integrated circuitry thereon, a stack of semiconductor dice of lesser lateral dimensions that the wafer segment secured to a surface thereof in thermally conductive communication therewith, the semiconductor dice mutually operably coupled by conductive elements therebetween in conductive contact with conductive through vias of the semiconductor dice, a non-conductive material between the semiconductor dice of the stack, and an encapsulant material extending peripherally about the dice of the stack and in contact with the surface of the wafer segment.

The semiconductor die assembly may further comprise, on a back side of the semiconductor die of the stack farthest from the wafer segment, at least partially exposed contacts to conductive through vias, redistribution circuitry including pads for testing of the stack of semiconductor dice operably coupled to conductive through vias, external connection conductive elements extending from the semiconductor die over and operably coupled to the at least partially exposed contacts to the conductive through vias, and passivation leaving the pads and external connection conductive elements exposed.

The wafer segment may further comprise a cavity extending into the surface and a semiconductor die of the stack adjacent to the wafer segment is at least partially received in the cavity.

The surface of the wafer segment may comprise a plurality of recesses and conductive elements extending from the active surface of a semiconductor die of the stack adjacent the wafer segment may be at least partially disposed in the plurality of recesses.

Figure 3A:
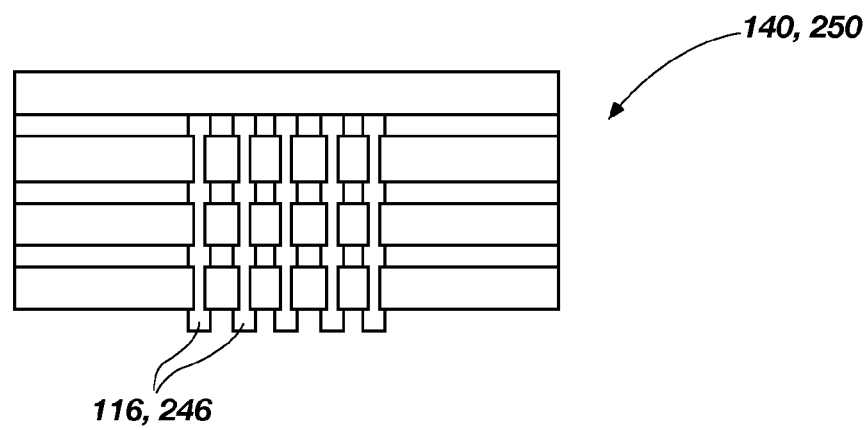
FIGS. 3A through 3C schematically illustrate a sequence for fabrication of a semiconductor device including a stacked die structure according to embodiments of the present disclosure, and the resulting semiconductor device.
Figure 3B:
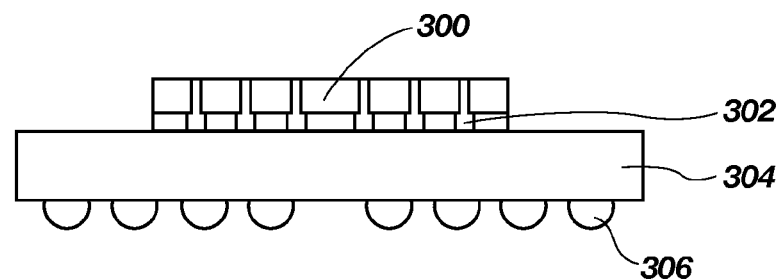
Figure 3C:
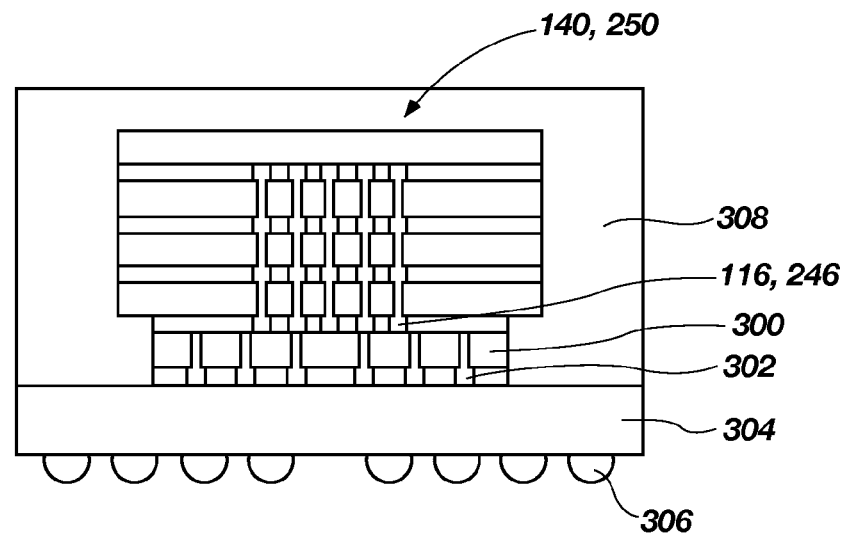

Referring now to FIGS. 3A through 3C, FIG. 3A depicts a schematic of a stacked die package 140, 250 according to an embodiment of the disclosure and as previously described herein, respectively, with regard to FIGS. 1G and 2M. In FIG. 3B, a logic die or SoC die 300 is schematically depicted mounted and electrically connected by conductive elements 302 to traces (not shown) of a carrier substrate, such as a ball grid array (BGA) substrate 304, having conductive elements 306, for example, solder balls, extending therefrom for connection to higher-level packaging. FIG. 3C depicts a stacked die package 140, 250 mounted and electrically connected to logic die or SoC die 300 and overmolded with a dielectric encapsulant material 308. As depicted in FIG. 3C, stacked die package 140, 250 may be of greater lateral extent than logic die or SoC die 300, with encapsulant material 308 extending over and around stacked die package 140, 250, filling a peripheral recess between stacked die package 140, 250 and carrier substrate 304 around logic die or SoC die 300 and in contact with BGA substrate 304.

A semiconductor device as described above comprises a carrier substrate comprising external connections on a surface thereof, one of a logic die and a system on a chip die mounted on an opposing surface of the carrier substrate and operably coupled to the external connections thereof, and an assembly. The assembly comprises a wafer segment devoid of integrated circuitry, a stack of semiconductor dice on a surface of the wafer segment having conductive through vias thereof connected with conductive elements extending therebetween and operably coupled to the one of a logic die and a system on a chip die, a non-conductive material between the semiconductor dice of the stack, and at least one encapsulant material extending over the wafer segment and peripherally about the wafer segment, the stack of semiconductor dice and the one of the logic die and the system on a chip die and in contact with the carrier substrate.

CONCLUSION

In one embodiment, a method of forming a semiconductor die assembly comprises securing a plurality of laterally spaced semiconductor dice to a base wafer, disposing at least two semiconductor dice over each semiconductor die of the plurality to form a stack and connecting conductive through vias of the semiconductor dice in a stack with conductive elements extending therebetween, providing a dielectric material between the semiconductor dice in a stack, substantially simultaneously encapsulating at least a periphery of each of the stacks of semiconductor dice on the base wafer with an encapsulant material between and around the stacks of semiconductor dice, and singulating the stacks of semiconductor dice and the base wafer through the encapsulant material between the stacks of semiconductor dice.

Another embodiment comprises a method of forming a semiconductor die assembly, comprising securing a plurality of laterally spaced semiconductor dice having conductive through vias to a base wafer having thermally conductive elements protruding therefrom in alignment with the conductive through vias, stacking a plurality of semiconductor die over each semiconductor die of the plurality of laterally spaced semiconductor dice and connecting conductive through vias of stacked semiconductor dice with conductive elements extending therebetween, introducing a dielectric material between the semiconductor dice, substantially simultaneously encapsulating at least a periphery of the semiconductor dice on the base wafer with an encapsulant material between and around the semiconductor dice, and severing through the encapsulant material and through the base wafer between stacks of semiconductor dice.

Yet another embodiment comprises a semiconductor die assembly, comprising a wafer segment having no integrated circuitry thereon, a stack of semiconductor dice of lesser lateral dimensions that the wafer segment secured to a surface thereof in thermally conductive communication therewith, the semiconductor dice mutually operably coupled by conductive elements therebetween in conductive contact with conductive through vias of the semiconductor dice, a non-conductive material between the semiconductor dice of the stack, and an encapsulant material extending peripherally about the dice of the stack and in contact with the surface of the wafer segment.

A further embodiment comprises a semiconductor device, comprising a carrier substrate comprising external connections on a surface thereof, one of a logic die and a system on a chip die mounted on an opposing surface of the carrier substrate and operably coupled to the external connections thereof, and an assembly comprising a wafer segment devoid of integrated circuitry, a stack of semiconductor dice on a surface of the wafer segment having conductive through vias thereof connected with conductive elements extending therebetween and operably coupled to the one of a logic die and a system on a chip die, a non-conductive material between the semiconductor dice of the stack, and at least one encapsulant material extending over the wafer segment and peripherally about the wafer segment, the stack of semiconductor dice and the one of the logic die and the system on a chip die and in contact with the carrier substrate.

While the disclosure is susceptible to various modifications and alternative forms, specific embodiments have been shown by way of example in the drawings and have been described in detail herein. However, the invention is not intended to be limited to the particular forms disclosed. Rather, the invention encompasses all modifications, equivalents, and alternatives falling within the scope of the invention as defined by the following appended claims and their legal equivalents.

What is claimed is:

1. A semiconductor die assembly, comprising:
    a semiconductor wafer segment having no integrated circuitry thereon;
    a stack of semiconductor dice of lesser lateral dimensions than the semiconductor wafer segment adjacent to a surface of the semiconductor wafer segment in thermally conductive communication therewith, the semiconductor dice mutually operably coupled by conductive elements therebetween in conductive contact with conductive through vias of the semiconductor dice;
    a non-conductive material between the semiconductor dice of the stack; and
    an encapsulant material extending peripherally about the dice of the stack and in contact with the surface of the semiconductor wafer segment.

2. The semiconductor die assembly of claim 1, wherein the semiconductor dice of the stack are oriented with active surfaces thereof facing in a common direction.

3. The semiconductor die assembly of claim 1, wherein the semiconductor dice of the stack are oriented with active surfaces thereof facing toward the semiconductor wafer segment.

4. The semiconductor die assembly of claim 1, further comprising:
    a dielectric over the surface of the semiconductor wafer segment; and
    a plurality of thermally conductive elements over the dielectric in a pattern corresponding to a pattern of the conductive through vias of the semiconductor dice of the stack and in thermally conductive contact with conductive through vias of a semiconductor die of the stack adjacent the semiconductor wafer segment.

5. The semiconductor die assembly of claim 1, wherein a semiconductor die of the stack adjacent the semiconductor wafer segment is secured thereto with one of a die attach film and a dielectric material.

6. The semiconductor die assembly of claim 1, wherein a semiconductor die of the stack adjacent the semiconductor wafer segment is secured thereto and the semiconductor dice of the stack are operably coupled using a metallic bond selected from the group consisting of a solder bond, a thermocompression bond and an ultrasonic bond.

7. The semiconductor die assembly of claim 1, further comprising, on a back side of the semiconductor die of the stack farthest from the semiconductor wafer segment:
    at least partially exposed contacts to conductive through vias;
    redistribution circuitry including pads for testing of the stack of semiconductor dice operably coupled to conductive through vias;
    external connection conductive elements extending from the semiconductor die over and operably coupled to the at least partially exposed contacts to the conductive through vias; and
    passivation leaving the pads and external connection conductive elements exposed.

8. The semiconductor die assembly of claim 1, wherein semiconductor dice of the stack are known good die.

9. The semiconductor die assembly of claim 1, wherein the semiconductor wafer segment further comprises a cavity extending into the surface; and
    a semiconductor die of the stack adjacent to the semiconductor wafer segment is at least partially received in the cavity.

10. The semiconductor die assembly of claim 1, wherein the surface of the semiconductor wafer segment comprises a plurality of recesses; and
    conductive elements extending from an active surface of a semiconductor die of the stack adjacent the semiconductor wafer segment are at least partially disposed in the plurality of recesses.

11. The semiconductor die assembly of claim 1, wherein the semiconductor wafer segment comprises a heat sink.

12. A semiconductor device, comprising:
- a carrier substrate comprising external connections on a surface thereof;
- one of a logic die and a system on a chip die mounted on an opposing surface of the carrier substrate and operably coupled to the external connections thereof; and
- an assembly comprising:
  - a semiconductor wafer segment devoid of integrated circuitry;
  - a stack of semiconductor dice on a surface of the semiconductor wafer segment having conductive through vias thereof connected with conductive elements extending therebetween and operably coupled to the one of a logic die and a system on a chip die;
  - a non-conductive material between the semiconductor dice of the stack; and
  - at least one encapsulant material extending over the semiconductor wafer segment and peripherally about the semiconductor wafer segment, the stack of semiconductor dice and the one of the logic die and the system on a chip die and in contact with the carrier substrate.

13. The semiconductor device of claim 12, wherein active surfaces of the semiconductor dice of the stack face in a common direction.

14. The semiconductor device of claim 12, wherein active surfaces of the semiconductor dice of the stack face toward the semiconductor wafer segment.

15. The semiconductor device of claim 12, further comprising:
- a dielectric between the surface of the semiconductor wafer segment and the stack of semiconductor dice; and
- a plurality of thermally conductive elements between the dielectric and the semiconductor dice of the stack in a pattern corresponding to a pattern of the conductive through vias of the semiconductor dice of the stack and in thermally conductive contact with conductive through vias of a semiconductor die of the stack adjacent the semiconductor wafer segment.

16. The semiconductor device of claim 12, wherein a semiconductor die of the stack adjacent the semiconductor wafer segment is secured thereto with a die attach film or a dielectric material.

17. The semiconductor device of claim 12, wherein a semiconductor die of the stack adjacent the semiconductor wafer segment is secured thereto and the semiconductor dice of the stack are operably coupled using a metallic bond selected from the group consisting of a solder bond, a thermocompression bond and an ultrasonic bond.

18. The semiconductor device of claim 12, further comprising, on a back side of the semiconductor die of the stack farthest from the semiconductor wafer segment:
- contacts to conductive through vias;
- redistribution circuitry including pads for testing of the stack of semiconductor dice operably coupled to conductive through vias;
- external connection conductive elements extending from the semiconductor die over and operably coupled to the contacts to the conductive through vias; and
- passivation leaving the pads and external connection conductive elements exposed.

19. The semiconductor device of claim 12, wherein semiconductor dice of the stack are known good die.

20. The semiconductor device of claim 12, wherein the semiconductor wafer segment further comprises a cavity extending into the surface; and
- a semiconductor die of the stack adjacent to the semiconductor wafer segment is at least partially received in the cavity.

21. The semiconductor device of claim 12, wherein the surface of the semiconductor wafer segment comprises recesses; and
- conductive elements extending from an active surface of a semiconductor die of the stack adjacent the semiconductor wafer segment are at least partially disposed in the recesses.

22. The semiconductor device of claim 12, wherein the semiconductor wafer segment comprises a heat sink.

* * * * *